United States Patent [19]
Kubo et al.

[11] Patent Number: 5,970,344
[45] Date of Patent: Oct. 19, 1999

[54] METHOD OF MANUFACTURING SEMICONDUCTOR DEVICE HAVING GATE ELECTRODES FORMED IN TRENCH STRUCTURE BEFORE FORMATION OF SOURCE LAYERS

[75] Inventors: Hirotoshi Kubo; Eiichiroh Kuwako; Masanao Kitagawa; Hiroaki Saito, all of Osaka, Japan

[73] Assignee: Sanyo Electric Co., Ltd., Osaka, Japan

[21] Appl. No.: 09/138,617

[22] Filed: Aug. 24, 1998

[30] Foreign Application Priority Data

Aug. 26, 1997 [JP] Japan ..................... 9-229511

[51] Int. Cl.⁶ .................................................. H01L 21/302
[52] U.S. Cl. ......................... 438/270; 438/735; 438/739
[58] Field of Search ................................... 438/270, 271, 438/272, 735

[56] References Cited

U.S. PATENT DOCUMENTS 5,514,604  5/1996  Brown ........................................ 438/270
5,578,508  11/1996  Baba .......................................... 438/270
5,688,725  11/1997  Darwish .................................... 438/270
5,693,547  12/1997  Gardner .................................... 438/270

FOREIGN PATENT DOCUMENTS 4-146674  5/1992  Japan .
5-335582  12/1993  Japan .

*Primary Examiner*—Benjamin Utech
*Assistant Examiner*—Bernadine Okoro
*Attorney, Agent, or Firm*—Wenderoth, Lind & Ponack, L.L.P.

[57]   ABSTRACT

A channel layer is formed in a surface of a semiconductor substrate, and a plurality of trenches are formed in the surface of the semiconductor substrate, the trenches being deeper than the channel layer. Then, gate electrodes are formed in the trenches, respectively, after which body layers are formed between the trenches and source layers are formed adjacent to the trenches.

5 Claims, 4 Drawing Sheets

METHOD OF MANUFACTURING SEMICONDUCTOR DEVICE HAVING GATE ELECTRODES FORMED IN TRENCH STRUCTURE BEFORE FORMATION OF SOURCE LAYERS

BACKGROUND OF THE INVENTION

1. Field of the Invention

The present invention relates to a method of manufacturing a semiconductor device, and more particularly to a method of manufacturing a vertical MOSFET (Metal-Oxide-Semiconductor Field-Effect Transistor) having a trench structure.

2. Description of the Prior Art

Recent vertical MOSFETs that have attracted much attention have a trench structure which includes a gate electrode embedded in a trench. Known structures of a vertical MOSFET having a trench structure and methods of fabricating such a vertical MOSFET are disclosed in Japanese laid-open patent publication Nos. 4-146674 and 5-335582, for example.

The structure of a known vertical MOSFET having a trench structure will be described below with reference to FIG. 1 of the accompanying drawings. As shown in FIG. 1, the vertical MOSFET includes a semiconductor substrate having a $p^-$ channel layer 12 in its surface, an $n^-$ drain layer 11a underneath the $p^-$ channel layer 12, and an $n^+$ drain layer 11b underneath the $n^-$ drain layer 11a. The semiconductor substrate has a number of trenches 13 defined in the $p^-$ channel layer 12 and extending vertically into the $n^-$ drain layer 11a. A gate oxide layer 14 is formed on the surface of each of the trenches 13, and a gate electrode 15 made of polycrystalline silicon or the like is embedded in each of the trenches 13. The vertical MOSFET also has a number of $p^+$ body layers 17 disposed on the surface of the $p^-$ channel layer 12 at respective positions intermediate between adjacent ones of the trenches 13. $N^{++}$ source layers 16 are disposed adjacent to the $p^+$ body layers 17 and the trenches 13. Insulating layers 18 are disposed on the respective gate electrodes 15. A metal electrode 19 made of aluminum or the like is disposed over the entire surface of a cell region of the vertical MOSFET. The insulating layers 18 isolate the gate electrodes 15 and the metal electrode 19 from each other. The metal electrode 19 is held in ohmic contact with the $n^{++}$ source layers 16 and the $p^+$ body layers 17.

When a voltage equal to or higher than a predetermined threshold is applied to the gate electrodes 15 between the drain layers 11a, 11b and the $n^{++}$ source layers 16, an n-type inverted layer is developed along the trenches in the $p^-$ channel layer 12, forming a current path thereby to turn on the region between the drain layers 11a, 11b and the $n^{++}$ source layers 16. When the voltage applied to the gate electrodes 15 is reduced below the predetermined threshold, the n-type inverted layer developed in the $p^-$ channel layer 12 is eliminated, turning off the region between the drain layers 11a, 11b and the $n^{++}$ source layers 16. Since the vertical current path is formed along the trenches 13 upon application of a voltage equal to or higher than the predetermined threshold, the current path has an area much greater than with a planar MOSFET, and hence the vertical MOSFET has a reduced resistance when it is turned on.

A process of manufacturing the conventional vertical MOSFET will be described below. First, a semiconductor substrate comprising an $n^+$ drain layer 11b with an $n^-$ drain layer 11a disposed thereon is prepared. A $p^-$ channel layer 12 is formed in the surface of a cell region of the semiconductor substrate by ion implantation or the like. Then, $p^+$ body layers 17 and $n^{++}$ source layers 16 are formed by ion implantation or the like. Thereafter, trenches 13 extending from the channel layer 12 into the drain layer 11a are formed substantially centrally in the respective $n^{++}$ source layers 16.

Gate oxide layers 14 are formed respectively in the trenches 13. A polycrystalline silicon film is deposited on the entire surface formed so far, and etched back to produce gate electrodes 15 embedded in the respective trenches 13. The entire surface is then covered with an insulating film, and apertures are formed in the insulating film above the source layers 16 and the body layers 17 by photolithography, leaving insulating films 18 respectively on the gate electrodes 15. A metal film such as a film of aluminum or the like is deposited on the entire surface, and processed by photolithography to form a metal electrode 19 on the entire surface of the cell region. The reverse surface of the $n^+$ drain layer 11b is formed with a metal back electrode. In this manner, a principal structure of the vertical MOSFET is completed.

The above process of manufacturing the conventional vertical MOSFET suffers the following problems: First, various heat treatment steps are required. For example, a heat treatment step for sacrifice oxidization is needed to form and remove an oxide layer for processing crystal defects, etc. caused due to the formation of the trenches 13 subsequent to the formation of the $n^{++}$ source layers 16. Other heat treatment steps include a heat treatment step for forming the gate oxide layers 14 and a heat treatment step for forming the gate electrodes 15 by CVD or the like. These heat treatment steps are responsible for causing the $n^{++}$ source layers 16 to be diffused again, developing a short channel between them and the drain layer 11a with a resulting increase in current leakage between the source and drain.

Secondly, since the trenches 13 are formed after the $n^{++}$ source layers 16 are formed and the gate electrodes 15 are embedded in the trenches 13 by etchback, when the gate electrodes 15 of polycrystalline silicon are etched back to a large depth with respect to the diffused depth of the source layers 16, the upper ends of the gate electrodes 15 tend to be separated from the lower ends of the source layers 16, with no overlapping region left between gate electrodes 16 and the source layers 15. As a consequence, the vertical MOSFET has a higher threshold, and suffers a reduced yield.

SUMMARY OF THE INVENTION

It is therefore an object of the present invention to provide a method of manufacturing a semiconductor device such as a vertical MOSFET having a reduced resistance when it is turned on and a low input capacity, through stable fabrication processing.

According to the present invention, there is provided a method of manufacturing a semiconductor device, comprising the steps of forming a channel layer in a surface of a semiconductor substrate, forming a plurality of trenches in the surface of the semiconductor substrate which are deeper than the channel layer, forming gate electrodes in the trenches, respectively, and forming body layers between the trenches and source layers adjacent to the trenches.

The trenches are formed in the surface of the semiconductor substrate, then the gate electrodes are embedded in the trenches, and the body layers and the source layers are formed on the surface of the semiconductor substrate. Therefore, the source layers can be formed in self-alignment with the gate electrodes so as to be superposed laterally on the upper ends of the gate electrodes in the trenches. After the source layers are formed, since no heat treatment steps at high temperatures are required, the source layers will not be diffused again, and a short channel will not be developed, so that no current leakage will be caused between the source and drain. Furthermore, because the source layers are formed in self-alignment with the gate electrodes after the gate electrodes are formed, even if the gate electrodes are etched back greatly, the lower ends of the source layers are positioned so as to be superposed laterally on the upper ends of the gate electrodes on the side walls of the trenches. The self-alignment of the source layers on the side walls of the trenches is effective to prevent the upper ends of the gate electrodes from being separated from the lower ends of the source layers, so that the semiconductor device will be prevented from having a higher threshold, and hence from being manufactured with a reduced yield.

In addition, the resistance of the semiconductor device when it is turned on is reduced, and the direction of a diffusion depth can be controlled with ease. Therefore, it is possible to reduce the input capacity (Ciss) of the gate electrodes.

The body layers and the source layers may be formed by forming a first layer on an entire surface of a cell region of the semiconductor substrate, forming a resist mask layer on the first layer, the resist mask layer having openings corresponding to the source layers, selectively etching away the first layer through the openings, leaving portions of the first layer as the source layers, and introducing an impurity through the openings into the channel layer to thereby form the body layers.

If the source layers are thus formed, there is required no photolithographic process forming the source layers, and hence the entire method can be simplified.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

A method of manufacturing a vertical MOSFET according to a first embodiment of the present invention will be described below with reference to FIGS. 2 through 6.

Figure 1:
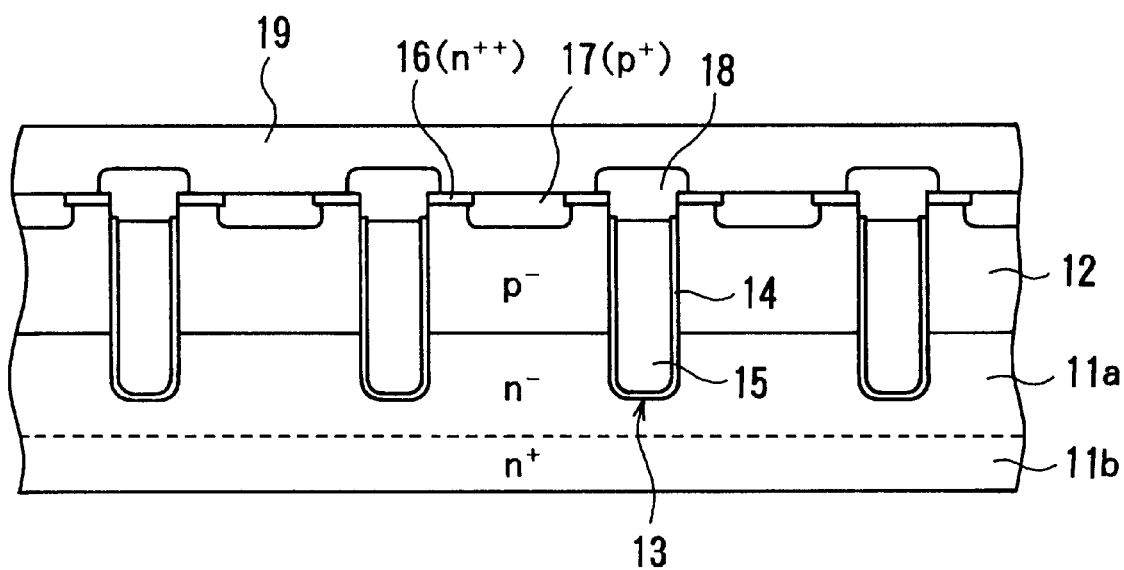
FIG. 1 is a fragmentary cross-sectional view of a conventional vertical MOSFET.
Figure 2:
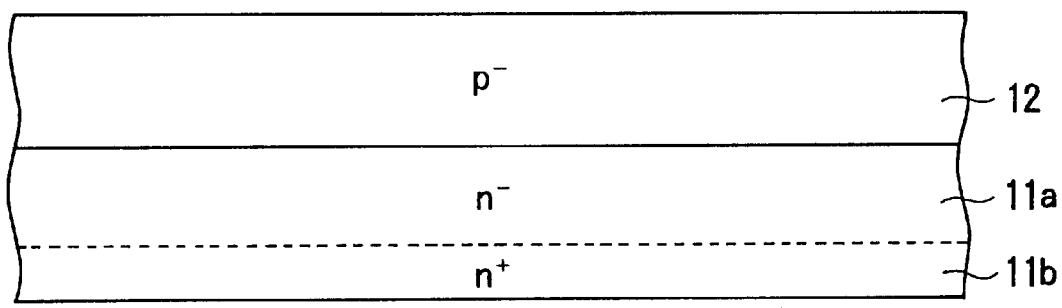
FIGS. 2 through 6 are fragmentary cross-sectional views illustrative of a method of manufacturing a vertical MOSFET according to a first embodiment of the present invention.

First, as shown in FIG. 2, a semiconductor substrate comprising an $n^+$ drain layer 11b with an $n^-$ drain layer 11a disposed thereon is prepared. An oxide layer is formed on the surface of the semiconductor substrate. Then, a resist mask pattern is formed for producing a guard ring, and a guard ring layer is formed around a chip surface by a p-type impurity introduced by ion implantation. Thereafter, an annular layer is formed around the guard ring by forming an opening in the oxide layer according to photolithography and then introducing an n-type impurity such as phosphorus or the like according to ion implantation or a diffusion process.

Then, a $p^-$ diffusion layer serving as a channel layer 12 is formed in the entire surface of a cell region by ion implantation, for example. Specifically, an oxide layer is formed on the entire surface, an opening is formed in the oxide layer over the cell region, and a p-type impurity of boron is introduced by ion implantation.

Figure 3:
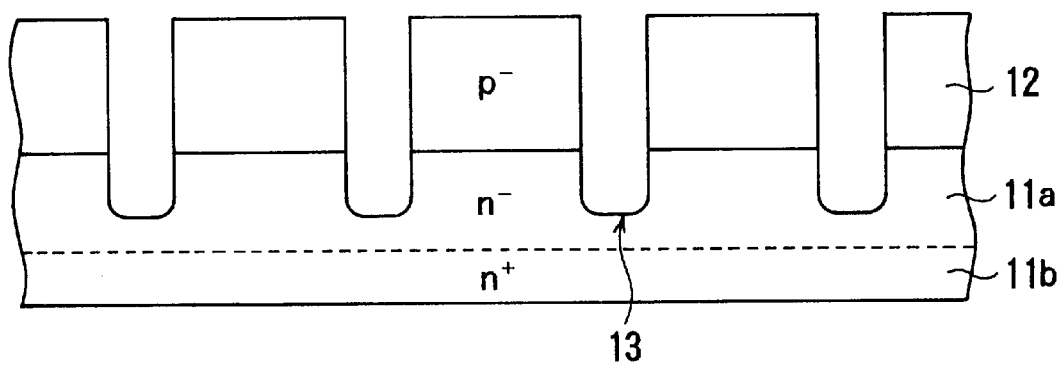

As shown in FIG. 3, trenches 13 are formed in the channel layer 12 so as to extend into the $n^-$ drain layer 11a by etching the semiconductor substrate. Specifically, an oxide layer is formed on the entire surface of the cell region, and openings are formed in the oxide layer by photolithography. Then, trenches 13 are formed in the channel layer 12 and also partly in the $n^-$ drain layer 11a by anisotropic gas etching through the openings. In order to remove defects developed in the silicon substrate due to the formation of the trenches, an oxide layer is formed in the trenches by sacrifice oxidization, and then removed for defect removal.

Figure 4:
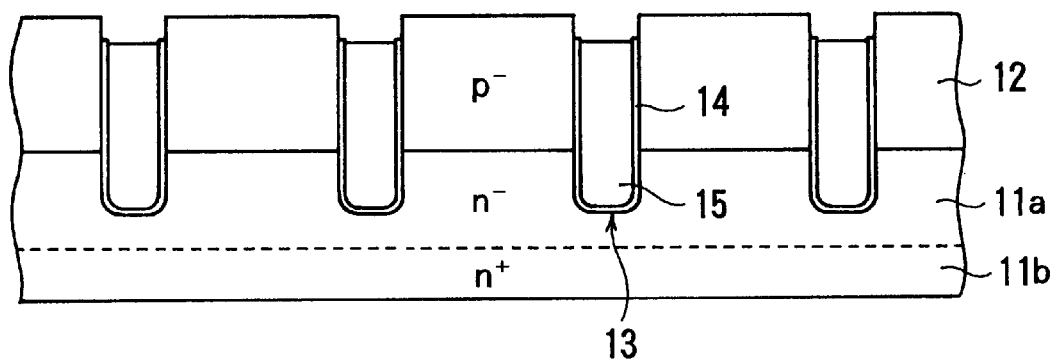

The oxide layer in the cell region is fully removed, and then gate oxide layers 14 are formed in the respective trenches 13 by gate oxidization. Then, a polycrystalline silicon film is deposited over the entire surface by CVD to fill the trenches 13 with polycrystalline silicon. The polycrystalline silicon film is then doped with phosphorus or boron, so that it is electrically conductive. Thereafter, the polycrystalline silicon film is etched back by isotropic gas etching, for example. The etchback is stopped when the surface of the silicon substrate is exposed, thereby forming gate electrodes 15 embedded in the respective trenches 13, as shown in FIG. 4.

Figure 5:
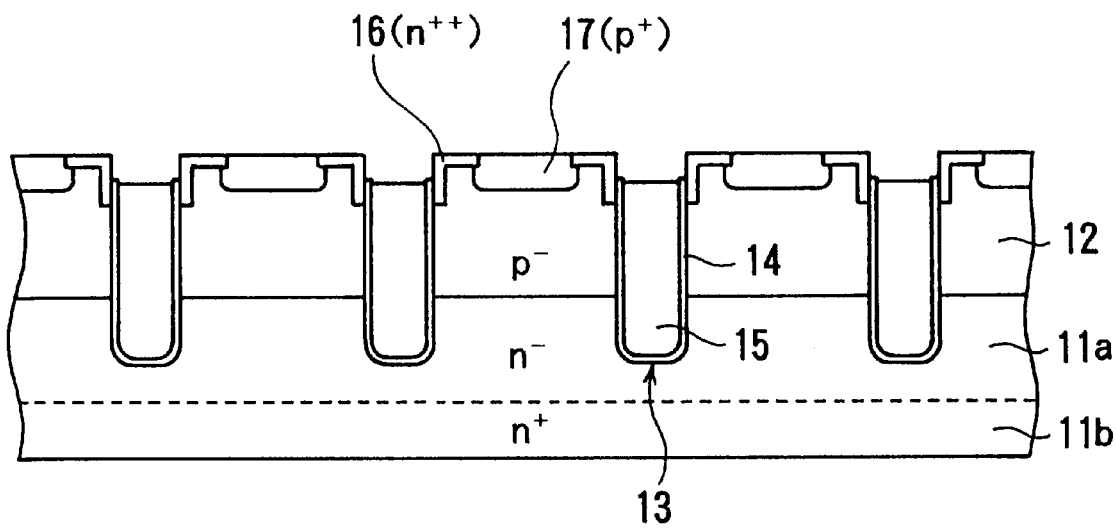
Figure 6:
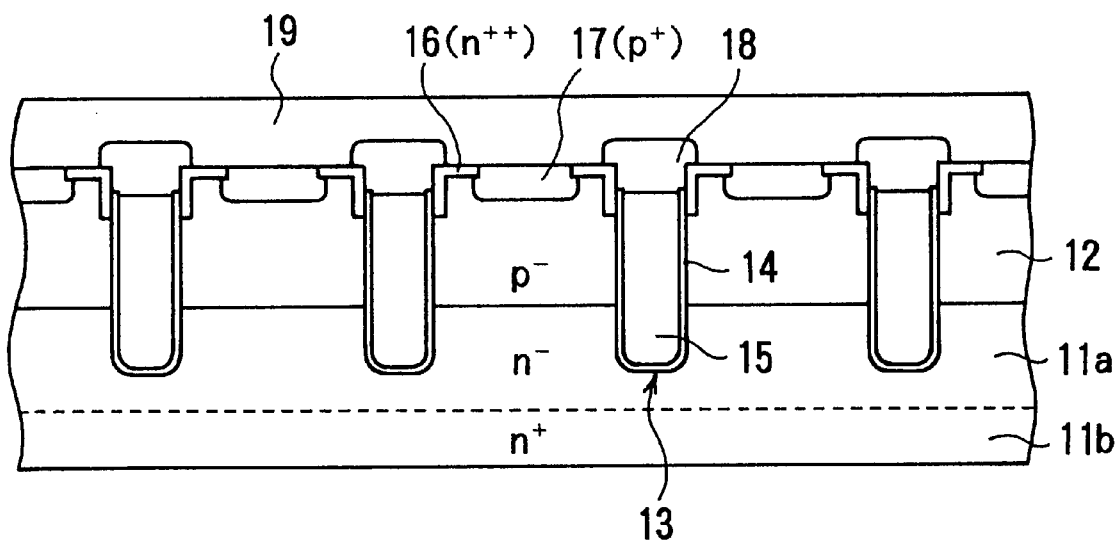

Then, as shown in FIG. 5, $p^+$ body layers 17 are formed on the surface of the channel layer 12. Specifically, resist mask openings are formed in regions corresponding to body layers by photolithography, and boron, for example, is introduced into the channel layer 12 through the resist mask openings by ion implantation, thus forming the $p^+$ body layers 17. Then, resist mask openings are formed in regions corresponding to source layers by photolithography, and arsenic, for example, is introduced into the channel layer 12 through the resist mask openings by ion implantation, thus forming $n^{++}$ source layers 16 on the surface of the channel layer 12.

Since the $n^{++}$ source layers 16 are formed by ion implantation using the upper ends of the gate electrodes 15 as a mask, they are formed as diffused layers by self-alignment with the gate electrodes 15 with respect to not only the surface of the semiconductor substrate but also the sides of the trenches 13, as shown in FIG. 5. Therefore, the $n^{++}$ source layers 16 are automatically superposed laterally on the upper ends of the gate electrodes 15 in the trenches 13. As a result, the resulting MOSFET will suffer reduced threshold voltage variations, and can be fabricated through stable fabrication processing.

Subsequently, an insulating film of NSG/BPSG or the like is deposited on the entire surface formed so far, and then selectively etched to form openings through which the source layers 16 and the body layers 17 are exposed, thus forming insulating layers 18 covering the gate electrodes 15. Then, a metal material such as aluminum is deposited on the entire surface by sputtering, patterned by photolithography, and alloyed to form a metal electrode 19 as a source electrode on the entire surface of the cell region. A passivation film is then deposited on the entire chip surface.

Afterword, a metal back electrode is formed on the reverse surface of the semiconductor substrate, namely on the $n^+$ drain layer 11b. In this manner, a vertical MOSFET is completed in the form of a wafer.

In the embodiment shown in FIGS. 2 through 6, the source layers 16 and the body layers 17 are formed using respective masks according to two photolithographic processes, respectively. However, the source layers 16 and the body layers 17 may be formed according to a single photolithographic process.

Figure 7:
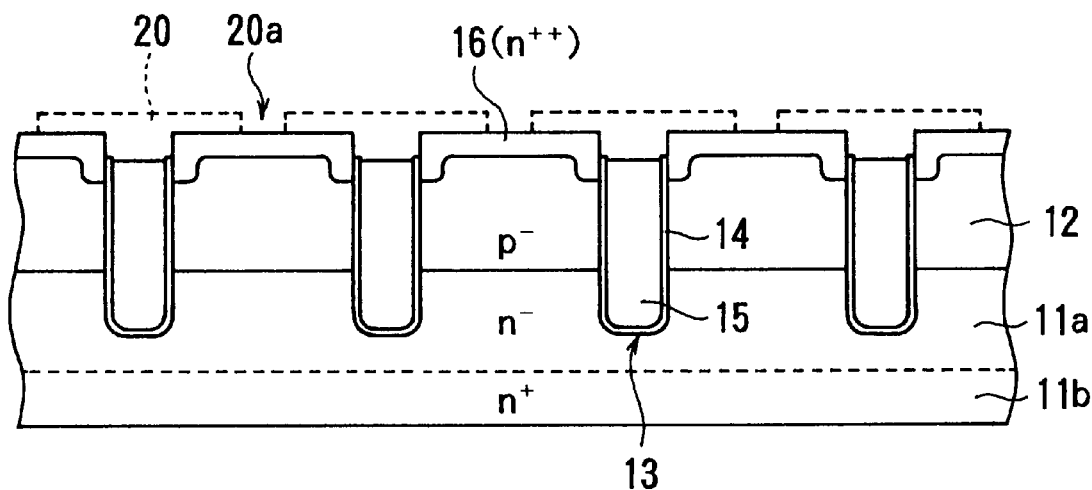
FIGS. 7 and 8 are fragmentary cross-sectional views illustrative of a method of manufacturing a vertical MOSFET according to a second embodiment of the present invention.
Figure 8:
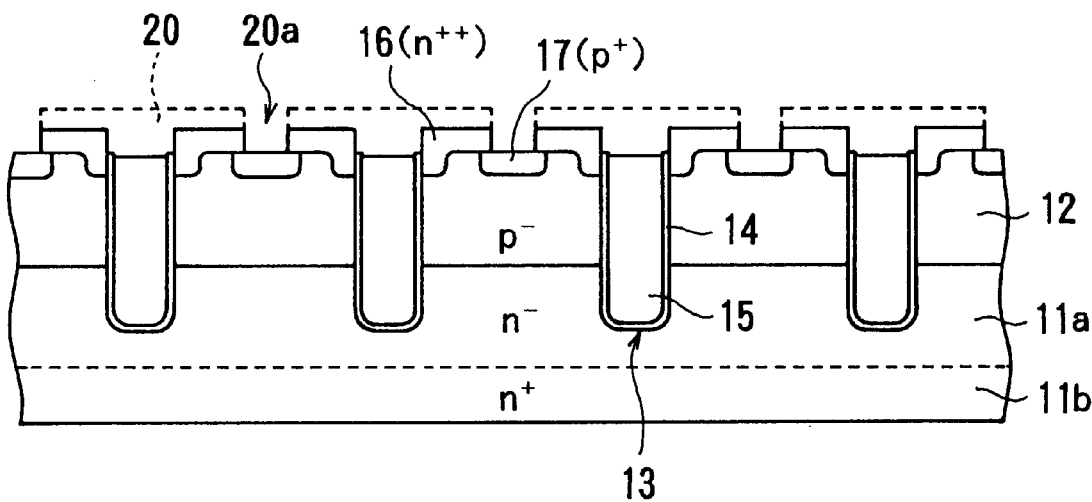

FIGS. 7 and 8 illustrate a method of manufacturing a vertical MOSFET according to a second embodiment of the present invention which employs a single photolithographic process for forming the source layers 16 and the body layers 17. Those parts shown in FIGS. 7 and 8 which are identical to those shown in FIGS. 2 through 6 are denoted by identical reference numerals, and will not be described in detail below.

According to the second embodiment, the steps shown in FIGS. 2 through 4 are carried out until the gate electrodes 15 are formed. After the gate electrodes 15 have been formed, an $n^{++}$ source layer 16 is formed on the entire surface of the cell region without using a mask. Using a mask for forming body layers, a resist mask pattern 20 having openings 20a is formed as indicated by the dotted lines in FIG. 7. The $n^{++}$ source layer 16 is selectively removed by gas etching through the openings 20a of the resist mask pattern 20. A p-type impurity is then introduced into the channel layer 12 through the openings 20a by ion implantation, thereby forming $p^+$ body layers 17. Accordingly, the entire method can be simplified as it does not require a photolithographic process which would otherwise be required to form source layers with accurate mask alignment.

The principles of the present invention, which are characterized by embedding the gate electrodes in the trenches and then forming the source layers in self-alignment with the gate electrodes, are not limited to the fabrication of vertical MOSFETs, but also applicable to the fabrication of IGBTs (Insulated-Gate Bipolar Transistors).

Although certain preferred embodiments of the present invention have been shown and described in detail, it should be understood that various changes and modifications may be made therein without departing from the scope of the appended claims.

What is claimed is:

1. A method of manufacturing a semiconductor device, comprising:

forming a channel layer in a surface of a semiconductor substrate;

forming a plurality of trenches in the surface of said semiconductor substrate which are deeper than said channel layer;

forming gate electrodes in said trenches, respectively;

forming body layers between said trenches; and after said gate electrodes have been formed in said trenches, forming source layers adjacent to said trenches by having said source layers align with the previously-formed gate electrodes such that said source layers are superposed laterally with upper ends of said gate electrodes.

2. A method according to claim 1, wherein said forming of said body layers between said trenches and said forming of said source layers adjacent said trenches comprises:

forming a first layer on an entire surface of a cell region of said semiconductor substrate;

forming a resist mask layer on said first layer, said resist mask layer having openings corresponding to the source layers;

selectively etching away said first layer through said openings, leaving portions of said first layer as said source layers; and introducing an impurity through said openings into said channel layer to thereby form said body layers.

3. A method according to claim 2, wherein said first layer comprises an impurity diffused region which is to be said source layer.

4. A method according to claim 1, wherein said channel layer is a $p^-$ region, said body layer is a $p^{++}$ region and said source layer is an $n^{++}$ region.

5. A method according to claim 1, wherein said body layers and said source layers are formed at said surface of said semiconductor substrate.

* * * * *